(12) United States Patent
Jung

(10) Patent No.: US 6,177,301 B1
(45) Date of Patent: Jan. 23, 2001

(54) METHOD OF FABRICATING THIN FILM TRANSISTORS FOR A LIQUID CRYSTAL DISPLAY

(75) Inventor: Yun-Ho Jung, Seoul (KR)

(73) Assignee: LG.Philips LCD Co., Ltd. (KR)

(*) Notice: Under 35 U.S.C. 154(b), the term of this patent shall be extended for 0 days.

(21) Appl. No.: 09/311,702

(22) Filed: May 13, 1999

(30) Foreign Application Priority Data

Jun. 9, 1998 (KR) .................................................. 98-21287

(51) Int. Cl.$^7$ ...................................................... H01L 21/00
(52) U.S. Cl. ............................ 438/150; 438/166; 438/30
(58) Field of Search .................................... 438/149, 150, 438/151, 152, 153, 154, 155, 156, 157, 158

(56) References Cited

U.S. PATENT DOCUMENTS

| | | | |
|---|---|---|---|
| 4,433,202 | * 2/1984 | Maruyama et al. | 136/255 |
| 5,432,122 | 7/1995 | Chae . | |
| 5,496,768 | 3/1996 | Kudo . | |
| 5,614,426 | * 3/1997 | Funada et al. | 437/40 |
| 5,616,506 | * 4/1997 | Takemura | 438/150 |
| 5,696,388 | 12/1997 | Funada et al. . | |
| 5,767,003 | 6/1998 | Noguchi . | |
| 5,817,548 | 10/1998 | Noguchi et al. . | |
| 5,858,807 | 1/1999 | Kawamura . | |
| 5,923,997 | * 7/1999 | Mitanaga et al. | 438/486 |
| 6,001,714 | * 12/1999 | Nakajima et al. | 438/525 |

FOREIGN PATENT DOCUMENTS

| | | |
|---|---|---|
| 0 141 506 | 5/1985 | (EP) . |
| 0 178 447 | 4/1986 | (EP) . |
| 0 456 199 | 11/1991 | (EP) . |
| 7-99314 | 4/1995 | (JP) . |
| 9-260684 | 10/1997 | (JP) . |
| 97/45827 | 12/1997 | (WO) . |
| WO 97/45827 | 12/1997 | (WO) . |

OTHER PUBLICATIONS

Robert S. Sposili, et al., Sequential lateral solidification of thin silicon films on $SiO_2$, Appl. Phyus. Lett 69 (19), Nov. 4, 1996, pp. 2864–2866.

James S. Im, et al., Single–crystal Si films for thin–film transistor devices, Appln. Phys. Lett. 70 (25), Jun. 23, 1997, pp. 3434–3436.

James S. Im, et al., Crystalline Si Films for Integrated Active–Matrix Liquid–Crystal Displays, MRS Bulletin, Mar. 1996, pp. 39–48.

James S. Im, et al., Single Crystal Silicon Films Via a Low–Substrate–Temperature Excimer–Laser Crystallization Method, MRS Abstract 1996 Fall Meeting.

J.P. Leonard, et al.,The Effect of Film Thickness and Pulse Duration Variation in Excimer Laser Crystallization of Thin Si Films, Mat. Res. Soc. Symp. Proc. vol. 452, pp. 947–952, 1997.

(List continued on next page.)

Primary Examiner—John F. Niebling
Assistant Examiner—Viktor Simkovic
(74) Attorney, Agent, or Firm—Long Aldridge & Norman

(57) ABSTRACT

A method of fabricating a thin film transistor (TFT) for a liquid crystal display (LCD) device having a drive circuit and a pixel array formed on the same substrate. The method includes forming a polycrystalline silicon layer by growing silicon grains from an amorphous silicon layer using the technique of sequential lateral solidification so that the silicon grains are oriented in a first direction, forming an active layer by patterning the polycrystalline layer, the active layer defining channel directions of the TFTs which are inclined at a predetermined angle with respect to the first direction, and forming the TFTs on the active layer. The method enhances the uniformity of the physical characteristics of the TFTs formed on the substrate.

12 Claims, 7 Drawing Sheets

OTHER PUBLICATIONS

R.S. Sposili, et al., Single–Crystal Si Films Via a Low–Substrate–Temperature Excimer–Laser Crystallization Method, Mat. Res. Soc. Symp. Proc. vol. 452, pp. 953–958, 1997.

J.S. Im, et al., Single–Crystal Si Films for Thin–film Transistor Devices, Apply. Phys. Lett. 70 (25), pp.3434–3436, Jun. 23, 1997.

M.A. Crowder, et al., Low–Temperature Single–Crystal Si TFTs Fabricated on Si Films Processed Via Sequential Lateral Solidification, IEEE Electron Device Letters, pp. 1–3, Sep. 1997.

J.S. Im, et al., Controlled Super–Lateral Growth of Si Films for Microstructural Manipulation and Optimization, Physics Status Solid, pp. 1–7 w/8 pages of figures, Feb. 22, 1998.

M.A. Crowder, et al. IEEE Electron Device Letters, Sep. 97, p. 1.*

* cited by examiner

METHOD OF FABRICATING THIN FILM TRANSISTORS FOR A LIQUID CRYSTAL DISPLAY

This application claims the benefit of Korean Patent Application No. 98-21287, filed on Jun. 9, 1998, which is hereby incorporated by reference.

BACKGROUND OF THE INVENTION

1. Field of the Invention

The present invention relates to a method of fabricating a thin film transistor for a liquid crystal display device.

2. Discussion of the Related Art

A liquid crystal display (LCD) device is fabricated by forming various devices on a transparent insulated substrate, such as a glass substrate. To fabricate a thin film transistor (TFT) on a weak heat-resistant or heat-sensitive substrate, such as a glass substrate, an amorphous silicon layer or a polycrystalline silicon layer is first formed on the substrate. An active layer for the TFT is then formed by etching the silicon layer. Characteristics of charge carrier mobility are excellent when a polycrystalline silicon layer is formed on the glass substrate. Accordingly, when a polycrystalline silicon layer is used, devices for a driver and a pixel array of the LCD device are fabricated on the same substrate simultaneously.

FIG. 1 is a schematic drawing of an LCD device on which a pixel array and a driver circuit are simultaneously formed on the same substrate. The pixel array 11 lies in the middle of the substrate 100, and a gate driver 12 and a data driver 13 are located near two sides of the pixel array 11 on the substrate 100. The pixel array 11 comprises a plurality of pixel cells 14 defined by a plurality of gate lines 15 connected to the gate driver 12 and a plurality of data lines 16 connected to the data driver 13. The gate driver 12 drives the pixel cells. The data driver 13 supplies the cells with data signals. The gate driver 12 and the data driver 13 receive external signals through external signal input terminals 17 and supply them to pixel cells 14. The drivers use inverters of complementary TFTs to generate proper signals for the pixel cells 14.

FIG. 2 is a schematic drawing of silicon grains 21 in a polycrystalline silicon layer which is formed according to a related art. According to FIG. 2, an amorphous silicon layer is formed on a substrate. A laser beam is applied to the amorphous silicon layer and moves by a predetermined distance for each laser pulse. Accordingly, the substrate is scanned by the laser beam, during which the portion of the silicon layer irradiated with the laser beam is melted and crystallized by solidification. By controlling laser energy properly, the portion of the silicon irradiated with the laser beam is almost completely melted, with an unmelted portion remaining at an interface between the silicon layer and the substrate.

In the portion of the silicon layer irradiated with the laser beam, silicon grains grow laterally, rather than in the direction of the thickness of the layer, by using other portions of the silicon that remain unmelted as seeds. Depending on a state of the amorphous silicon layer and the laser energy supply, the seeds are located at an interface between the substrate. Therefore, a polycrystalline silicon layer having grains of irregular sizes at random locations is formed.

When fabricating a TFT of a coplanar type, an active layer is formed by patterning a polycrystalline layer formed on the insulated substrate using, e.g., photolithography. A gate insulating layer and a gate electrode are then formed on the active layer, and a source and a drain region are formed by doping the active layer with impurities to form a TFT for the LCD device.

FIG. 3 shows a schematic layout of a polycrystalline silicon TFT according to the related art. The grain pattern of the active layer has no significance on the channel direction because the silicon grains in the active layer are scattered irregularly on the substrate. Referring to FIG. 3, a plurality of silicon grains 34 are included in an active layer 30 of the TFT. The charges moving from the source region 31 through the channel region 32 toward the drain region 33 of the TFT are greatly affected by the grain boundaries in the channel region. Hence, the charge carrier mobility of the polycrystalline silicon TFT is much smaller than that of a single crystalline silicon TFT. Moreover, physical characteristics of the TFT formed on the substrate are irregular since the polycrystalline silicon layer contains irregular grains.

Accordingly, circuit malfunctioning may occur in the gate and data drivers which include TFTs, causing external signals to be transferred unevenly to the gate and data lines. In addition, the TFTs formed irregularly in the pixel array may cause the image characteristics of the LCD to deteriorate.

SUMMARY OF THE INVENTION

Accordingly, the present invention is directed to a method of fabricating thin film transistors for a liquid crystal display device that substantially obviates one or more of the problems due to limitations and disadvantages of the related art.

An object of the present invention is to provide a method of fabricating TFTs for an LCD by which physical characteristics of TFTs on a substrate become uniform.

Additional features and advantages of the invention will be set forth in the description which follows, and in part will be apparent from the description, or may be learned by practicing the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, a method of fabricating a thin film transistor (TFT) for a liquid crystal display device having a driver and a pixel array formed on a substrate comprises the steps of forming a polycrystalline silicon layer on the substrate by growing silicon grains in a first direction from an amorphous silicon layer using a sequential lateral solidification technique; forming an active layer by patterning said polycrystalline silicon layer, said active layer defining a channel of the TFT having a direction inclined at a predetermined angle with respect to said first direction; and forming the TFT on the active layer.

According to another embodiment of the present invention, a method of fabricating a liquid crystal display (LCD) device having a driver and a pixel array formed on a substrate comprises the steps of forming a polycrystalline silicon layer on the substrate by growing silicon grains in a first direction from an amorphous silicon layer using a sequential lateral solidification technique; forming an active layer by patterning said polycrystalline silicon layer, said active layer defining a plurality of channel regions having a second direction inclined at a predetermined angle with respect to said first direction; and forming a plurality of thin film transistors (TFTs) on the active layer, the channel regions of the active layer forming the channels of the TFTs, wherein the TFTs are devices for the driver and the pixel array of the LCD device.

In another aspect of the present invention, a liquid crystal display (LCD) device comprises a gate drive circuit having a plurality of thin film transistors (TFTs); a data drive circuit having a plurality of TFTs; a plurality of gate lines and data lines connected to the gate and data drive circuits, respectively; and a pixel array having a plurality of pixel cells defined by the gate lines and data lines, each pixel cell having a TFT, wherein each TFT has a channel region formed of a thin polycrystalline silicon layer by a sequential lateral solidification technique, the polycrystalline silicon layer having elongated silicon grains grown laterally in a predetermined direction and having substantially no grain boundaries in the direction of the thickness of the layer, and wherein the TFTs define a channel direction which is inclined at a predetermined angle with respect to the growth direction of the silicon grains.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF PREFERRED EMBODIMENTS

According to the present invention, an active layer of the TFT is fabricated by patterning a polycrystalline silicon layer which is formed by growing silicon grains using the technique of sequential lateral solidification. A method according to the present invention for forming an LCD device having a driver and a pixel array formed on the same substrate includes the steps of forming a polycrystalline silicon layer by growing silicon grains in a first direction from an amorphous silicon layer using the technique of sequential lateral solidification, forming an active layer by patterning the polycrystalline silicon layer, wherein the active layer defines a channel direction oriented at a predetermined angle with respect to the first direction, and forming the gate, source and drain electrodes of the thin film transistor. Uniformity of the devices are ensured when the predetermined angle is 0 degree or between 30 and 60 degrees and when the channel directions of the TFTs are the same throughout the entire substrate.

The preferred embodiments of the present invention will now be described in detail, examples of which are illustrated in the accompanying drawings.

Figure 1:
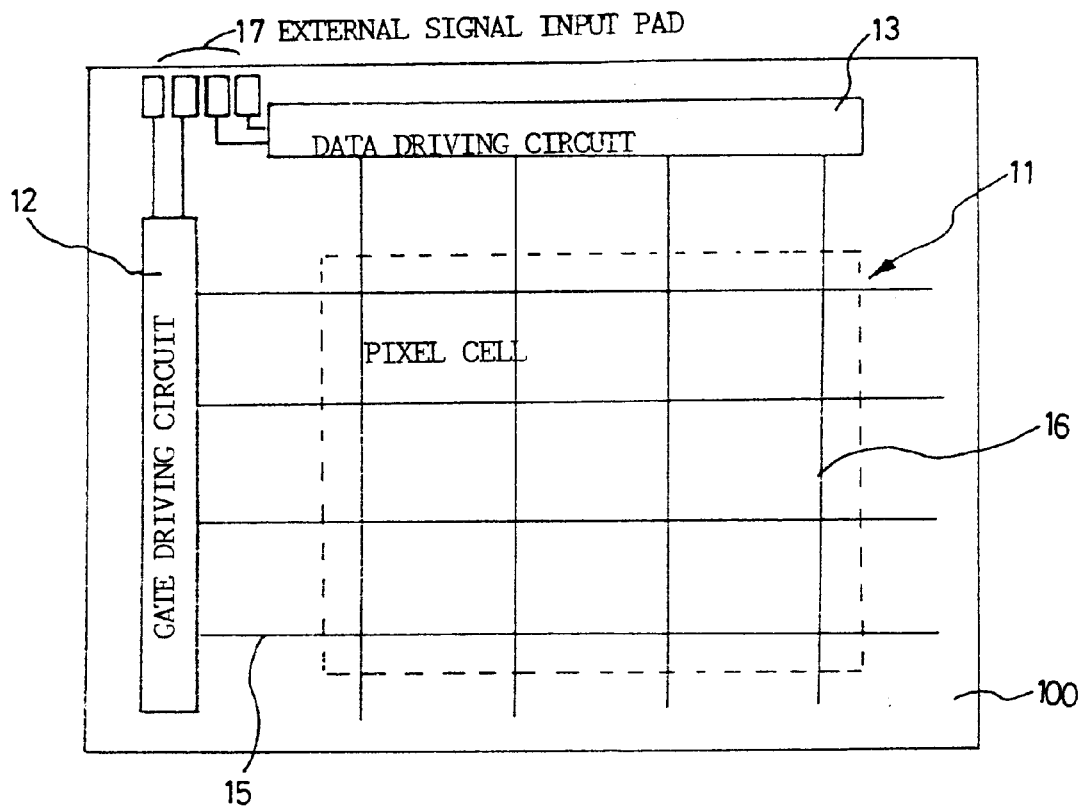
FIG. 1 is a schematic layout of an LCD device having a driver formed integrally on the FIG. 2 schematically illustrates the state of the silicon grains in a polycrystalline silicon TFT according to the related art.
Figure 2:
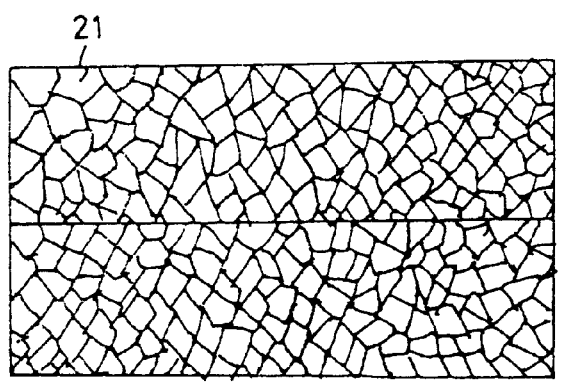
Figure 3:
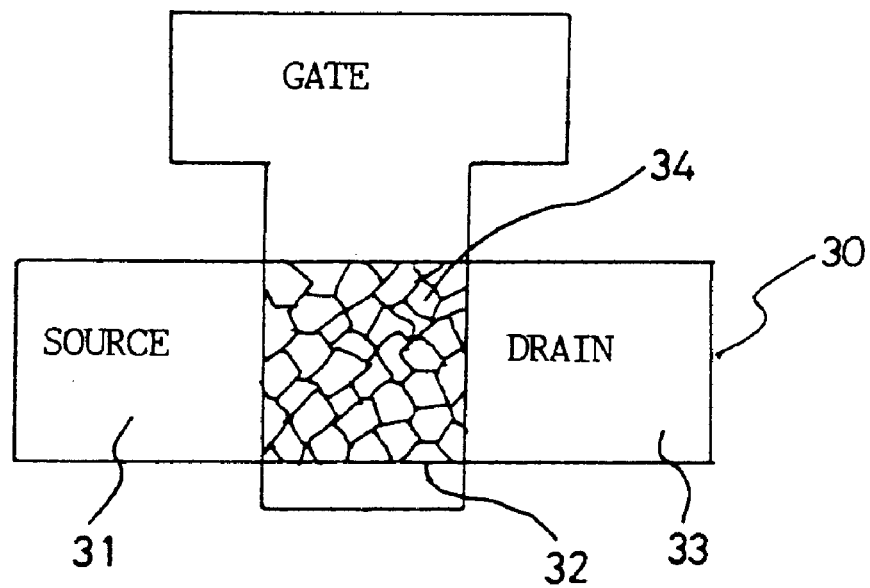
FIG. 3 illustrates a layout of a TFT having a polycrystalline silicon layer shown in FIG. 2.
Figure 4A:
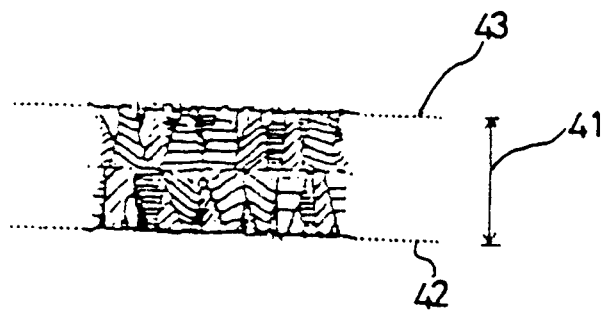
FIGS. 4A to 4C illustrate a method for crystallizing an amorphous silicon film using the SLS technique.
Figure 4B:
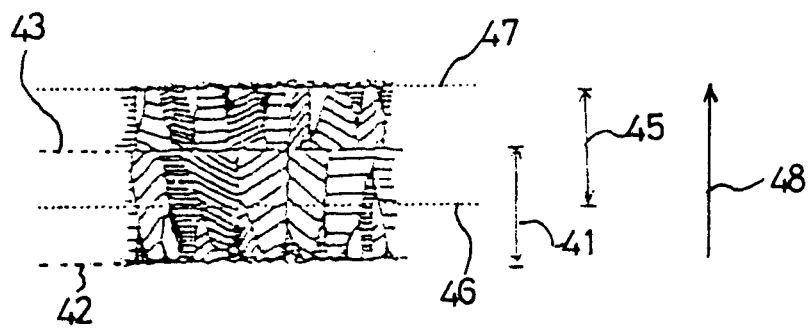
Figure 4C:
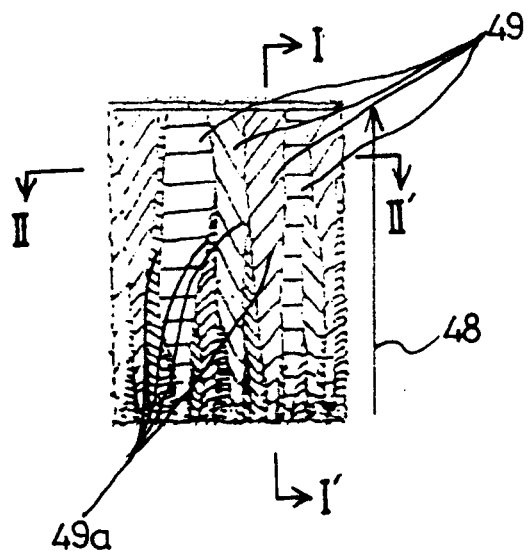

FIGS. 4A to 4C illustrate a method for crystallizing an amorphous silicon film using the SLS technique. A technique of forming a single crystalline silicon layer on a glass substrate by SLS is described in Robert S. Sposilli, M. A. Crowder, and James S. Im, Mat. Res. Soc. Symp. Proc. Vol. 452, 956–957, 1997. The technique, using the fact that silicon grains tend to grow vertically against the interface between liquid and solid silicon, teaches that an amorphous silicon layer is crystallized by controlling the magnitude of laser energy and an irradiation range of a moving laser beam to form silicon grains grow laterally up to a predetermined length.

SLS is one technique that forms the silicon layer, by applying laser to an amorphous silicon layer. Here, the displacement of the laser beam is shorter than the length of lateral growth of the crystal. Consequently, silicon particles which are longer than 10 $\mu$m are formed on a glass substrate. The foregoing technique is disclosed in "Crystalline Si Films For Integrated Active Matrix Liquid-Crystal Displays," MRS Bulletin, Volume XXI, Number 3, March 1996, pp. 39–48.

Moreover, the location, size, and shape of a crystal particle may be controlled by manipulating the shape of a slit through which a laser beam passes, which enables the formation of silicon particles that are larger than an active area of a TFT. Thus, it is possible to fabricate a TFT of single crystalline silicon manufactured by forming an active area of the TFT as a single crystal particle.

Referring to FIG. 4A, a narrow region 41 of the film having the shape of a straight slit bounded by dashed lines 42 and 43 is irradiated with a laser beam at an energy density sufficient to induce complete melting of the silicon. Subsequently, lateral grain growth proceeds from the unmelted regions adjacent the narrow strip region 41 which is fully melted. The grain boundaries in such directionally solidified materials tend to form in a direction substantially perpendicular to the interface between a unmelted and the melted regions. Depending on the width of the molten region, lateral growth cease when either one of the following occur, whichever is first: (1) the two opposing growth fronts collide at the center, or (2) the melted region becomes sufficiently supercooled so that bulk nucleation of solids occur. Because of these factors, the maximum lateral growth distance that can be achieved with a single laser pulse is limited to a certain length, which may be referred to as the single-pulse lateral growth distance. The single-pulse lateral growth distance depends on the film thickness and the incident laser energy density.

Referring to FIG. 4B, the laser beam image is translated relative to the film in the direction indicated by the arrow 48 over a distance less than the single-pulse lateral growth distance. A narrow region 45 bound by dashed lines 46 and 47 is irradiated by a second laser pulse. After the second laser pulse, lateral grain growth recommences from the edges of the completely melted region 45. Since one of these edges, in this case the edge 46, is located within the silicon region grown during the previous irradiation step, the lengths of the silicon grains formed by the previous irradiation are extended by the second irradiation beyond the single-pulse lateral growth distance.

Referring to FIG. 4C, the above-cited irradiating and solidifying processes are repeated as many times as necessary to grow silicon grains of any desired length. The final microstructure of the silicon layer obtained in this fashion is shown in FIG. 4C, showing grains 49 extending in the direction of the laser beam scan 48, as well as grain boundaries 49a. The lengths of the silicon grains formed by the above SLS technique is remarkably large.

Figure 5A:
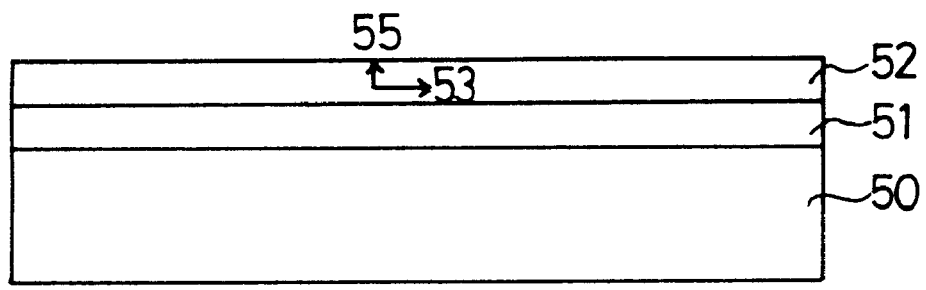
FIG. 5A and FIG. 5B are cross-sectional views of a silicon layer of FIG. 4C along the lines I–I' and II–II', respectively.
Figure 5B:
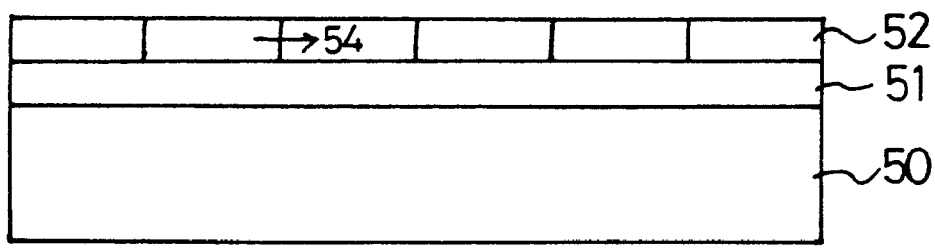

FIGS. 5A and 5B show the cross-sectional drawings along the lines I—I and II—II of FIG. 4C. Here, a silicon layer 52, formed by SLS crystallization technique is superimposed on an insulating layer 51, which is in turn, located on an insulating substrate 50.

According to the SLS technique used herein, the silicon grains proceed by means of lateral grain growth. Thus, the grain boundaries in directionally solidified materials tend to form perpendicularly to the melt interface. A single pulse grain growth is larger than the thickness of the amorphous silicon film.

Therefore, the SLS silicon thin film 52, as shown in FIG. 5A, has no boundary in both a first direction 53, i.e., the crystallizing direction (in FIG. 4C), and a second direction 55 which is longitudinal to the substrate. The only silicon grain shown in the silicon thin film 53 in FIG. 5A, which is a cross-sectional drawing along the line I—I in FIG. 4C.

However, the SLS silicon thin film 52 has a plurality of boundaries in a third direction 54, i.e., the perpendicular direction to the first direction 53, the crystallizing direction.

Therefore, a plurality of silicon grains may be shown in the silicon thin film 52 in FIG. 5B, which is a cross-sectional drawing along the line II—II in FIG. 4C.

Figure 6:
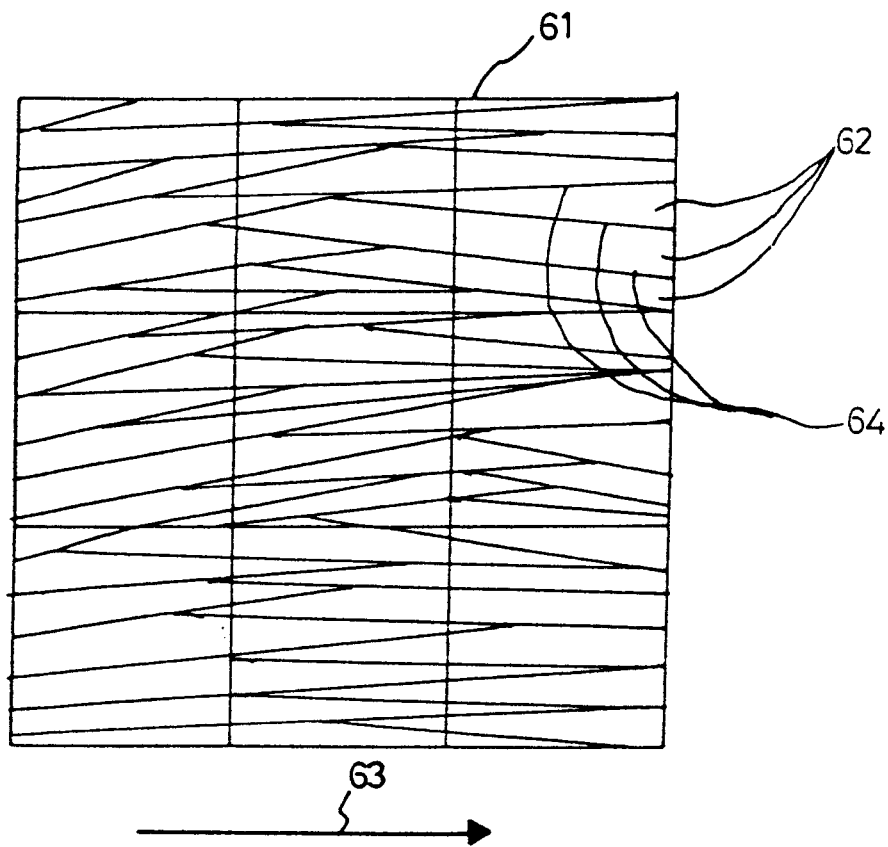
FIG. 6 shows a state of the silicon grains of a polycrystalline silicon layer formed by sequential lateral solidification.

FIG. 6 is a top view showing the whole surface of the SLS silicon layer. The SLS silicon layer 61 is formed using the SLS technique by growing silicon grains 62 in the direction of the laser beam scan 63. A plurality of grain boundaries 64 also extend in the same direction as the direction of the laser beam scan 48.

To fabricate a TFT of a coplanar type using a method according to the present invention, an active layer is formed by patterning the polycrystalline silicon layer formed on an insulated substrate. A gate insulating layer and a gate electrode are then formed, and a source and a drain region are formed by doping the active layer with impurities to form the TFT.

Figure 7A:
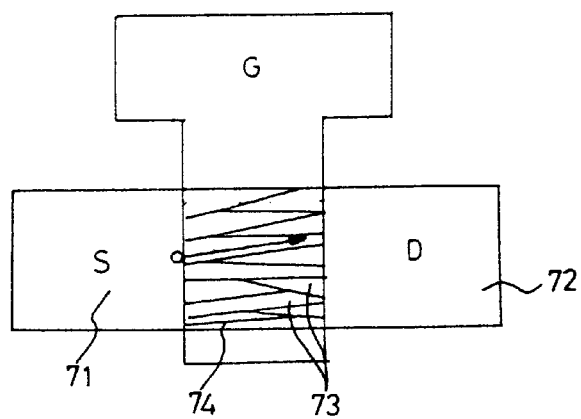
FIGS. 7A–7C show TFTs having a polycrystalline silicon layer as that shown in FIG. 6.
Figure 7B:
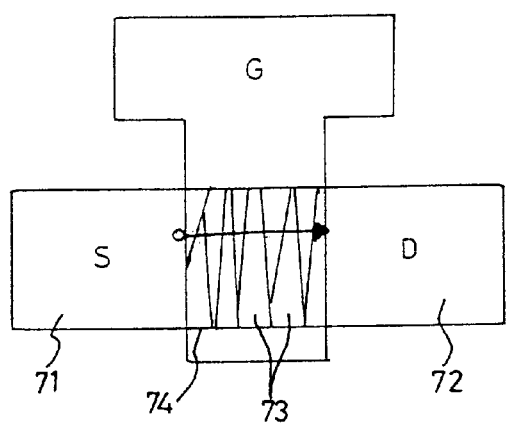
Figure 7C:
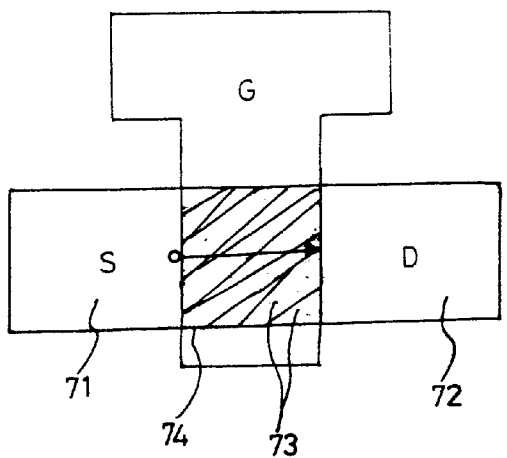

FIGS. 7A–7C show layouts of various examples of TFTs having polycrystalline silicon layers crystallized by using SLS and the patterning method according to the present invention. Three examples are shown, where the channel direction (defined by the direction that points from the source region 71 to the drain region 72) are at different angles with respect to the growth direction of the grains 73.

FIG. 7A shows a first TFT having a channel direction which is inclined 0 degree with respect to the growth direction of silicon grains 73 in the channel region 74.

Referring to FIG. 7A, the channel direction lies in parallel with the growth direction of silicon grains 73. There are minimum grain boundaries to inhibit the mobility of electric charge carriers in the channel region. Accordingly, the TFT having the construction of FIG. 7A shows the same or comparable physical characteristics as a single crystalline silicon TFT.

FIG. 7B shows a second TFT having a channel direction which is inclined 90 degrees with respect to the growth direction of the silicon grains 73 in the channel region 74. Referring to FIGS. 7B, a channel direction is formed to be perpendicular to a growth direction of silicon grains. The mobility of electric charge carriers is low as charge carriers moving through the channel region are inhibited by a plurality of grain boundaries. Accordingly, the TFT having the construction of FIG. 7B shows the same or comparable physical characteristics as a TFT formed of polycrystalline silicon having small grains.

FIG. 7C shows a third TFT having a channel direction which is inclined 45 degrees with respect to the growth direction of silicon grains 73. While 45 degrees is illustrated in this example, any angle between 0 and 90 degrees may be used. In this case, electric charge carriers moving through the channel region have to pass through a plurality of grain boundaries. The charge carrier mobility is good since the number of silicon grains in the channel region is smaller than that of the related art. The characteristics of the TFTs are uniform throughout the entire LCD device when the channel direction has an inclination between 30 to 60 degrees with respect to the growth direction of the silicon grains. This is because the active layer in the channel regions of all the TFTs have approximately equal numbers of grain boundaries. A TFT having the above construction has physical characteristics and circuit performance better than those of a polycrystalline silicon TFT.

It is important for an LCD device to have semiconductor devices having uniform characteristics in the driver and the pixel array. Image characteristics of the LCD improves significantly when signals for the gate and data lines are transferred to all pixels uniformly and when the pixels have uniform physical characteristics.

When an LCD device using a polycrystalline silicon layer having grains grown laterally by the SLS method is to be fabricated, the TFTs should be formed such that the physical characteristics of the TFTs in the drive circuit and the pixel array are uniform. For this purpose, the first TFT shown in FIG. 7A which has the same characteristics as a single crystalline silicon TFT may be used for the driver and/or the pixel array.

Moreover, the third TFT shown in FIG. 7C which has an excellent electric charge carrier mobility and the same number of grain boundaries among the TFTs may be used for the driver and/or the pixel array.

Figure 8:
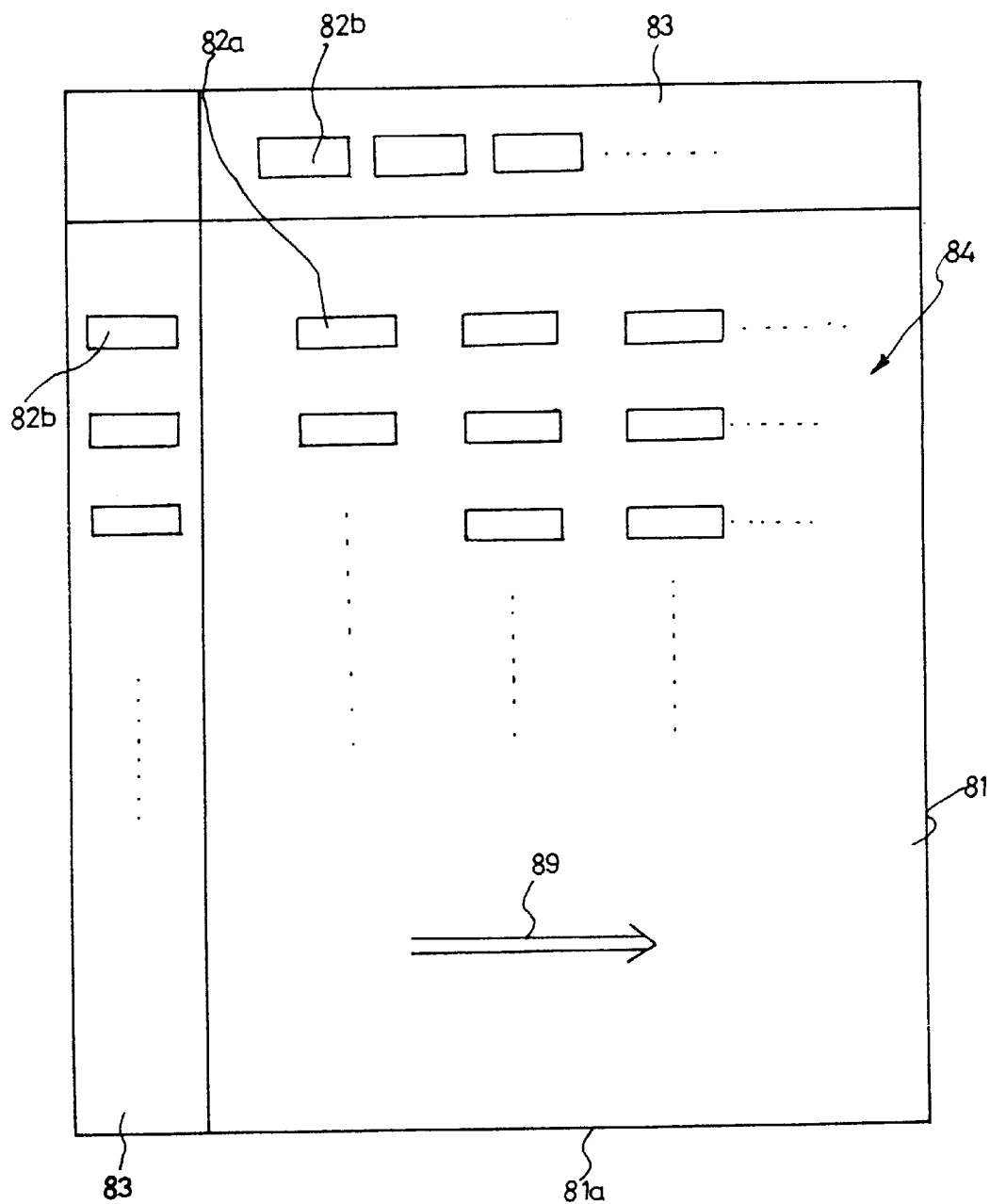
FIG. 8 shows a pattern of active layers of the TFTs on an entire substrate.

FIG. 8 illustrate patterns of an active layer for the first type of TFTs shown in FIG. 7A which ensure uniformity among the TFTs across the entire substrate 81. The active layer is a polycrystalline silicon layer of silicon grains grown a first direction 89 by crystallizing an amorphous silicon layer using SLS.

Each block 82a or 82b indicates an area of the active layer accommodating the channel region of a TFT. In the example illustrated in FIG. 8, the TFTs 82a in the pixel array 84 and the TFTs in the data and gate drive circuits 83 have channel regions that are in the same direction and are parallel to the crystallizing direction 89 by SLS.

As pointed out above, when TFTs are formed in an SLS silicon layer, it is important to form and arrange patterns of active layers where the channel directions are determined by the growth direction of the silicon grains. Uniformity of devices through the whole substrate is obtained by forming the TFTs so that their channels are oriented in the same direction.

In addition, TFTs having excellent physical characteristics are formed uniformly on the entire substrate by forming the TFTs so that their channel directions are inclined at a predetermined angle with respect to the growth direction of the silicon grains.

It will be apparent to those skilled in the art that various modifications and variations can be made in the method of fabricating a thin film transistor for a liquid crystal display of the present invention without departing from the spirit or scope of the invention. Thus, it is intended that the present invention covers the modifications and variations of the illustrated embodiments provided they come within the scope of the appended claims and equivalents.

What is claimed is:

1. A method of fabricating a thin film transistor (TFT) for a liquid crystal display device having a driver and a pixel array formed on a substrate, said method comprising the steps of:

forming a polycrystalline silicon layer on the substrate by growing silicon grains in a first direction from an amorphous silicon layer using a sequential lateral solidification technique;

forming an active layer by patterning said polycrystalline silicon layer, said active layer defining a channel of the TFT having a direction inclined at a predetermined angle with respect to said first direction, wherein said predetermined angle is between about 30 and 60 degrees; and forming the TFT on the active layer.

2. The method according to claim 1, wherein said TFT is a device for the driver.

3. The method according to claim 1, wherein said predetermined angle is about 45 degrees.

4. A method of fabricating a liquid crystal display (LCD) device having a driver and a pixel array formed on a substrate, comprising the steps of:

forming a polycrystalline silicon laver on the substrate by growing silicon grains in a first direction from an amorphous silicon layer using a sequential lateral solidification technique;

forming an active layer by patterning said polycrystalline silicon layer, said active layer defining a plurality of channel regions having a second direction inclined at a predetermined angle with respect to said first direction, wherein said predetermined angle is between about 30 and 60 degrees; and forming a plurality of thin film transistors (TFTs) on the active layer, the channel regions of the active layer forming the channels of the TFTs, wherein the TFTs are devices for the driver and the pixel array of the LCD device.

5. The method according to claim 4, wherein said predetermined angle is about 45 degrees.

6. The method according to claim 4, wherein the channel directions of the TFTs are the same throughout the entire substrate.

7. A method of forming a liquid crystal display device having a gate driving circuit having a plurality of thin film transistors and a data driving circuit having a plurality of thin film transistors, the method comprising:

forming a plurality of gate lines and data lines connected to the gate and data drive circuits, respectively; and forming a pixel array having a plurality of pixel cells defined by the gate lines and data lines, each pixel cell having a thin film transistor, wherein each thin film transistor has a channel region formed of a thin polycrystalline silicon layer by a sequential lateral solidification technique, the polycrystalline silicon layer having elongated silicon grains grown laterally in a predetermined direction and having substantially no grains with a longitudinal axis in the direction of the thickness of the layer, and wherein the thin film transistors define a channel direction which is inclined at a predetermined angle between about 30 and 60 degrees with respect to the growth direction of the silicon grains.

8. The method according to claim 7, wherein channel regions of the thin film transistors of the gate driver circuit have substantially the same direction as channel regions of the thin film transistors of the data driver circuit.

9. The method according to claim 7, wherein channel regions of the thin film transistors of the gate driver circuit have substantially the same direction as the channel region of the thin film transistor of each pixel cell.

10. The method according to claim 7, where in channel regions of the thin film transistors of the data driver circuit have substantially the same direction as the channel region of the thin film transistor of each pixel cell.

11. The method according to claim 7, wherein channel regions of the thin film transistors of the gate and data driver circuits have substantially the same direction as the channel regions of the thin film transistor of each pixel cell.

12. A method of fabricating a thin film transistor (TFT) for a liquid crystal display device having a driver and a pixel array formed on a substrate, said method comprising:

forming a polycrystalline silicon layer on the substrate by growing silicon grains in a first direction from an amorphous silicon layer using a sequential lateral solidification technique;

forming an active layer for each TFT by patterning said polycrystalline silicon layer, said active layer defining a channel of the TFT having a direction inclined at a predetermined angle between about 30 and 60 degrees with respect to said first direction;

wherein active layers of substantially all TFTs of the liquid crystal display device have approximately equal numbers of grain boundaries.

* * * * *